United States Patent [19]

Ciszek

[11] Patent Number: 5,304,534
[45] Date of Patent: Apr. 19, 1994

[54] METHOD AND APPARATUS FOR FORMING HIGH-CRITICAL-TEMPERATURE SUPERCONDUCTING LAYERS ON FLAT AND/OR ELONGATED SUBSTRATES

[75] Inventor: Theodore F. Ciszek, Evergreen, Colo.

[73] Assignee: The United States of America as represented by the United States Department of Energy, Washington, D.C.

[21] Appl. No.: 432,938

[22] Filed: Nov. 7, 1989

[51] Int. Cl.$^5$ ............................................. C30B 15/02
[52] U.S. Cl. ................................... 505/434; 505/704; 505/729; 505/730; 505/739; 505/740; 505/741; 505/742; 505/452; 505/470
[58] Field of Search ............... 156/600, 624; 505/1, 505/704, 729, 730, 739, 740, 741, 742; 427/434.6, 434.7

[56] References Cited

U.S. PATENT DOCUMENTS

| | | | |
|---|---|---|---|
| 3,796,553 | 3/1974 | Daunt | 29/191.2 |
| 3,815,224 | 6/1974 | Pickus et al. | 29/599 |
| 4,336,280 | 6/1982 | Moller | 427/62 |
| 4,596,207 | 6/1986 | Witt et al. | 118/314 |
| 4,865,681 | 9/1989 | Mattes | 156/624 |
| 4,908,346 | 3/1990 | Strom et al. | 427/63 |
| 4,914,081 | 4/1990 | Miller et al. | 505/1 |
| 4,939,308 | 7/1990 | Maxfield et al. | 156/603 |

FOREIGN PATENT DOCUMENTS

| | | | |
|---|---|---|---|
| 63-318025 | 12/1988 | Japan | 505/740 |
| 61-60916 | 3/1989 | Japan | 505/740 |
| 64-60918 | 3/1989 | Japan | 505/740 |
| 64-71014 | 3/1989 | Japan | 505/740 |
| 1-149316 | 6/1989 | Japan | 505/740 |
| 1-149317 | 6/1989 | Japan | 505/740 |

OTHER PUBLICATIONS

Shimizu et al. "Tape Conductor Fabrication Processes For High Tc-BA$_2$YCu$_3$O$_7$", Japanese Journal of Applied Physics, vol. 37, No. 3, Mar. 1988, pp. L414-L416.
Jin et al, "High Tc Superconductors-Composite Wire Fabrication", Applied Physics Letters, vol. 37 (3) Jul. 20, 1987, pp. 203-204.
Higashida et al. "Magnetic Measurements of Superconducting Glass-Ceramic Fine Rods . . . ", Applied Physics Letters vol. 55(15) Oct. 9, 1989 pp. 1578-1580.
High-critical-temperature superconductor made from glass, Nature, vol. 332, p. 575, Apr. 14, 1988.
Superconductivity-researchers use laser process to develop new type of fibers, "Stanford Observer", May 1988, pp. 1 and 12.
S. Jin, et al., Fabrication of dense Ba$_2$YCu$_3$O$_{7-6}$ superconductor wire by molten oxide processing, Appl. Phys. Lett., vol. 51, No. 12, pp. 943-945, Sep. 21, 1987.
M. Mimura, et al., Improvement of the Critical Current Density in the Silver Sheathed Bi-Pb-Sr-Ca-Cu-O Superconducting Tape, Appl. Phys. Lett., vol. 54, No. 16, pp. 1582-1584, Apr. 17, 1989.

*Primary Examiner*—Robert Kunemund
*Attorney, Agent, or Firm*—Kenneth L. Richardson; Bradley W. Smith; William R. Moser

[57] ABSTRACT

An elongated, flexible superconductive wire or strip is fabricated by pulling it through and out of a melt of metal oxide material at a rate conducive to forming a crystalline coating of superconductive metal oxide material on an elongated, flexible substrate wire or strip. A coating of crystalline superconductive material, such as Bi$_2$Sr$_2$CaCu$_2$O$_8$, is annealed to effect conductive contact between adjacent crystalline structures in the coating material, which is then cooled to room temperature. The container for the melt can accommodate continuous passage of the substrate through the melt. Also, a second pass-through container can be used to simultaneously anneal and overcoat the superconductive coating with a hot metallic material, such as silver or silver alloy. A hollow, elongated tube casting method of forming an elongated, flexible superconductive wire includes drawing the melt by differential pressure into a heated tubular substrate.

26 Claims, 4 Drawing Sheets

METHOD AND APPARATUS FOR FORMING HIGH-CRITICAL-TEMPERATURE SUPERCONDUCTING LAYERS ON FLAT AND/OR ELONGATED SUBSTRATES

CONTRACTUAL ORIGIN OF THE INVENTION

The United States Government has rights in this invention pursuant to Contract No. DE-AC02-83CHI0093 between the United States Department of Energy and the Solar Energy Research Institute, a Division of the Midwest Research Institute.

BACKGROUND OF THE INVENTION

1. Field of the Invention

This invention relates generally to superconductive materials and more specifically to a method and apparatus for making elongated, flexible superconductive strips and wires.

2. Description of the Prior Art

Superconductive materials are materials that have the characteristic of conducting an electric current virtually without resistance. In such superconductive materials, once a flow of electric current has been started, it will continue flowing in a closed loop indefinitely, even after removal of the electric source.

The superconductive materials known at present include metals, for example, iridium, lead, mercury, niobium, tin, tantalum, and vanadium, and many alloys, metal oxides, and other chemical compounds, in which their resistivities practically disappear at temperatures approaching absolute zero. The temperature at which such a material undergoes a transition from a normal conductor to a superconductor is called the transition temperature or critical temperature, $T_c$. A desirable goal of researchers in this field is, of course, to develop superconductive materials that have higher critical temperatures, preferably in the range of normal room temperatures. That goal has, so far, been elusive, and it might not be reached. However, it is significant that materials having critical temperatures near 100K have been formulated, an achievement that at the present time is considered to be very significant and exciting.

Unfortunately, the superconductive materials that have been formulated to date with the higher transition or critical temperatures, such as, $Bi_2Sr_2CaCu_2O_8$, are very similar to ceramic oxides and are very brittle. Therefore, they have little or no capability of bending or being wound into a coil, such as for a solenoid, which is one of the most desirable apparatus formats for using superconductivity in practical applications. Japanese researchers at the Technological University of Nahaoga reported in the Apr. 14, 1988, issue of NATURE, Vol. 332, p. 575, that they had succeeded in making glass panes or sheets of this material by melting various combinations of bismuth, calcium, strontium, aluminum, lead, and copper oxides at 1150° C., quenching the melts by pouring them on an iron plate, quickly pressing them into a slab, and subsequently annealing them. However, the goal of forming these materials into elongated, superconductive wires or strips has also remained elusive prior to this invention.

There have been several attempts to fabricate elongated strips or wires of superconductive materials. For example, U.S. Pat. No. 3,796,553, issued to J. Daunt, and U.S. Pat. No. 3,815,224, issued to M. Pickus et al., disclose processes of preparing a porous matrix of ductile and thermally conductive metal, infiltrating the voids in the matrix with a ductile, superconductive material, and then drawing the material into long, narrow wires. However, these methods are apparently limited to ductile superconductive materials; but, as mentioned above, is not a characteristic of the brittle, high-$T_c$ superconducting oxide materials.

U.S. Pat. No. 4,336,280, issued to A. Möller, discloses a process of depositing Nb and Ge layers on a long substrate from a gas mixture of Nb, Ge, $H_2$, and water vapor. U.S. Pat. No. 4,596,207, issued to A. Witt et al., while related to semiconductors rather than superconductors, is of general interest in showing a melt-spinning technique for forming a composite, elongated metal ribbon with one or more layers of different metals or alloys deposited in laminar fashion on a spinning platform.

The May 1988 issue of *Stanford Observer* reported the development of a melt drawing method of fabricating up to 15 in. of bismuth, calcium, strontium, copper, and oxygen ($Bi_2Sr_2CaCu_2O_8$) wire. A laser is used in that process to melt the surface of a source rod that is cut from a conventional pellet of the material so that a seed crystal can be introduced into the melted end and drawn out at a controlled rate to produce the crystalline wire strand.

M. Mimura, et al., in their article "Improvement of the Critical Current Density in the Silver Sheathed Bi-Pb-Sr-Ca-Cu-O superconducting Tape," Appl. Phys. Lett., Vol. 54, No. 16, pp. 1582-84, Apr. 17, 1989, describe a process of packing powders of the superconducting material in silver tubes or sheaths, then cold working them with a swaging machine and a grooved rolling machine into short (3 cm) wire shapes. These short wire lengths were then subjected to a combination process of alternate heat treatments and cold working treatments, ultimately forming them into tapes or strips. This process, M. Mimura, et al. report, improves the coupling between grains of the superconducting material, which contributes to better critical current density ($J_c$) at the critical or transition temperature ($T_c$). Unfortunately, that process is hot conducive to continuous production of continuous strands of indeterminate lengths.

S. Jin et al., in their article "Fabrication of Dense $Ba_2YCu_3O_{7-\delta}$ Superconductor Wire by Molten Oxide Processing," Appl. Phys. Lett., Vol. 51, No. 12, Sep. 21, 1987, described their investigations of three different processes, including melt drawing, melt spinning, and preform-wire melting. The melt drawing process involved heating a bar-shaped, pressed compact of fine $Ba_2YCu_3O_{7-\delta}$ powder to about 1200°-1300° C. with a blow torch and then pulling to draw the material into wire forms about 10 mm long. The melt spinning technique was similar to the Witt et al. U.S. Pat. No. 4,596,207 described above to the extent that a droplet of molten material ($Ba_2YCu_3O_{7-\delta}$) is deposited on the surface of a rapidly rotating mandrel to obtain a wire strand 40 mm long. The preform-wire melting process described by Jin et al. is perhaps the most relevant to the present invention in that it uses a metal wire core initially as a substrate for the metal oxide material. The metal oxide ($Ba_2YCu_3O_{7-\delta}$) powder was mixed with a binder, coated onto the surface of the metal wire core, dried, and sintered into a hard shell coating around the metal wire core. Finally, the outside surface of the metal oxide shell was melted by rapidly moving a torch flame over the shell surface. A 25-mm strand was fabricated, although Jin et al. suggest that longer, perhaps even continuous, wires or ribbons might be obtainable with this process.

All the attempts described above to obtain long, bendable or flexible wire strands of superconductive material have moved the technology forward, but they still have their respective problems. For example, the respective melt drawing processes described above are limited to lengths that can be pulled in single crystals, which are too short and fragile to be of much practical use. The melt spinning processes are fragile, limited in length, and not suitable for mass production and commercial use. The Pickus et al. and Daunt processes require ductile superconductive materials, so they are of little value for the higher-$T_c$ oxide materials, which are hard and rigid or brittle. The gas deposition technique of the Möller patent described above is limited to certain materials that can be deposited from gaseous forms. Conventional vapor depositions, sputtering, and the like are somewhat inefficient, expensive, and wasteful of both source material and energy.

SUMMARY OF THE INVENTION

Consequently, it is a general object of this invention to provide a method and apparatus for producing elongated, bendable or flexible wire strands of superconductive materials suitable for use as power transmission lines, energy storage windings, and other industrial and commercial applications.

Another general object of this invention is to provide a method and apparatus for fabricating elongated, flexible strands of rigid, oxide-type materials.

A more specific object of this invention is to provide a more efficient method and apparatus for forming rigid oxide-type superconductive materials into elongated, flexible strands.

Another specific object of this invention is to provide a more efficient method and apparatus for coating an elongated core wire strand with a superconductive oxide-type material in such a manner that the material maintains its superconductivity in such elongated, flexible strand form.

Still another object of the present invention is to provide a method and apparatus for producing elongated strands of metal-core/superconductor/metal-clad composite wires or strips in continuing, indeterminate lengths in a continuous process.

Additional objects, advantages, and novel features of the invention will be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method of this invention may comprise the steps of mixing powders of metal oxide constituents of the desired superconductive material in predetermined molar ratios; heating the mixture to a temperature high enough to result in a liquid melt of the mixture; immersing an elongated, flexible substrate in the melt and withdrawing it at a rate conducive to growing a crystalline coating of the mixture on the surface of the substrate; and cooling the coated substrate to room temperature. An annealing step for the coating can also be used to effect continuous conductive contacts between crystalline structures, and both the coating and annealing steps can be done in various atmospheres, such as an $O_2$ atmosphere, particularly where it is beneficial to the formation of oxide-type superconductive coatings. Continuous coating processes, as well as specific metal oxide materials, coating, and annealing temperatures are included. A differential pressure casting method for hollow-core substrates is also included.

The apparatus of this invention for the continuous coating process includes a container for the melt with a heater to maintain the desired temperature ranges, and openings in the container for passing an elongated substrate through the melt in a continuous coating process. An annealing chamber and take-up apparatus for moving the substrate through the melt in the container can also be included.

BRIEF DESCRIPTION OF THE DRAWINGS

The accompanying drawings, which are incorporated in and form a part of the specification, illustrate preferred embodiments of the present invention and together with the description, serve to explain the principles of the invention. In the drawings.

DETAILED DESCRIPTION OF THE PREFERRED EMBODIMENTS

Figure 1:
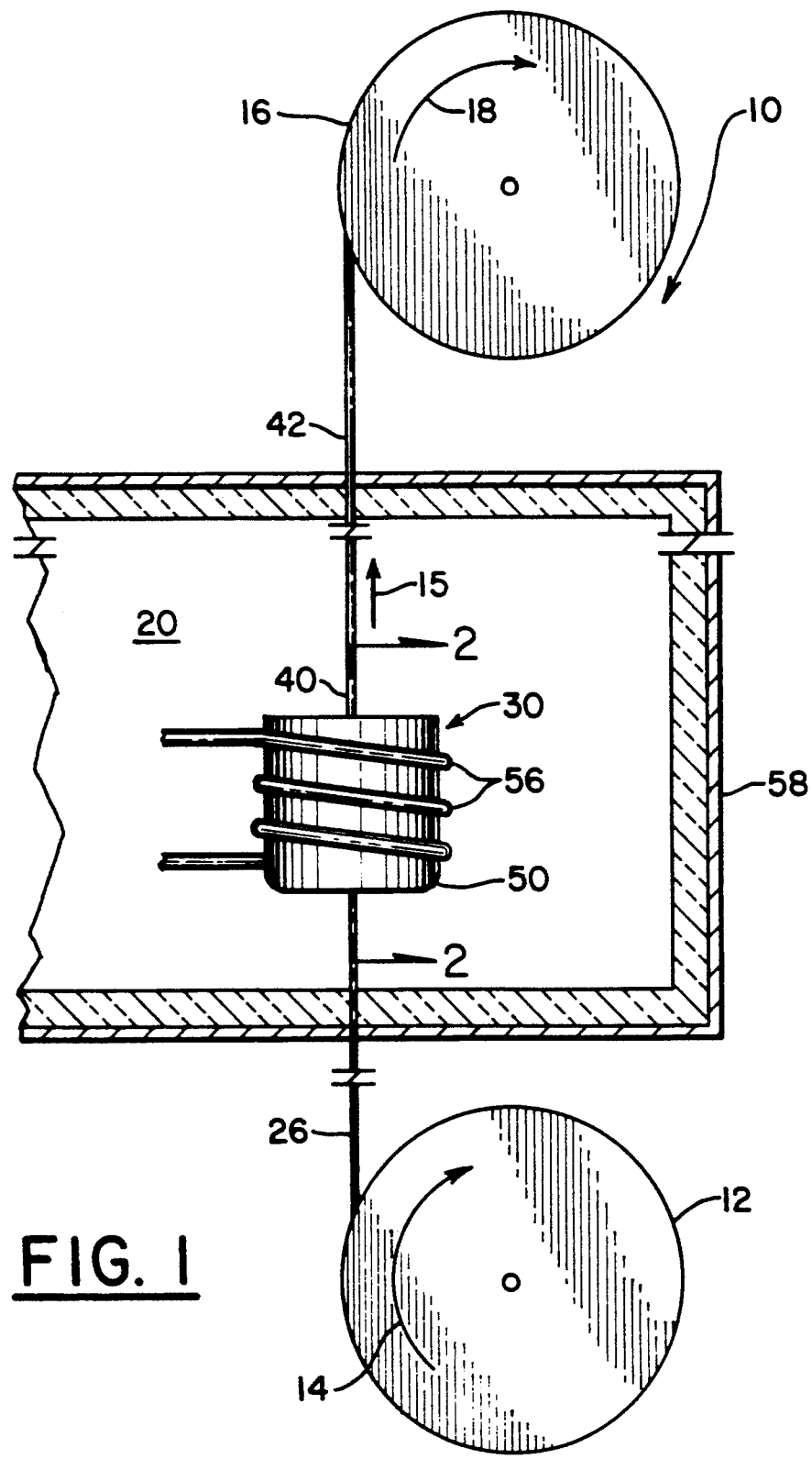
FIG. 1 is an elevation view of the apparatus used in this invention for forming superconductive layers on elongated substrates.

The apparatus 10 shown in FIG. 1 can be used according to this invention for thin-coating a superconductive material on the surface of an elongated substrate in a continuous process. This process is particularly adapted for coating oxide-type, high-critical-temperature ($T_c$) superconducting materials, which are typically rigid and brittle in their solid states, onto the surfaces of elongated, flexible wire or strip substrates in layers thin enough to flex or bend with the substrate without breaking or interfering with their superconductivity. The allowable radius of curvature for such flexing decreases monotonically with decreasing substrate and coating thickness.

The apparatus 10, as illustrated in FIG. 1, includes the melting and coating apparatus 30, an annealing chamber 20, a rotatable supply spool 12, and a rotatable take-up spool 16. An elongated, flexible substrate 26, preferably in the form of a wire or strip, is unwound from the supply spool 12 rotating in the direction indicated by arrow 14 so that it extends through the coating apparatus 30 and annealing chamber 20, moving in the direction indicated by arrow 15 to the take-up reel 16. The take-up reel 16 rotates in the direction indicated by arrow 18 to wind the coated, superconductive strand 28 thereon for storage. Of course, the coated, superconductive strand 28 could also be pulled through the apparatus linearly with some roller or other pulling apparatus (not shown) or wound directly onto a solenoid body (not shown) or other appliance, as desired.

Figure 2:
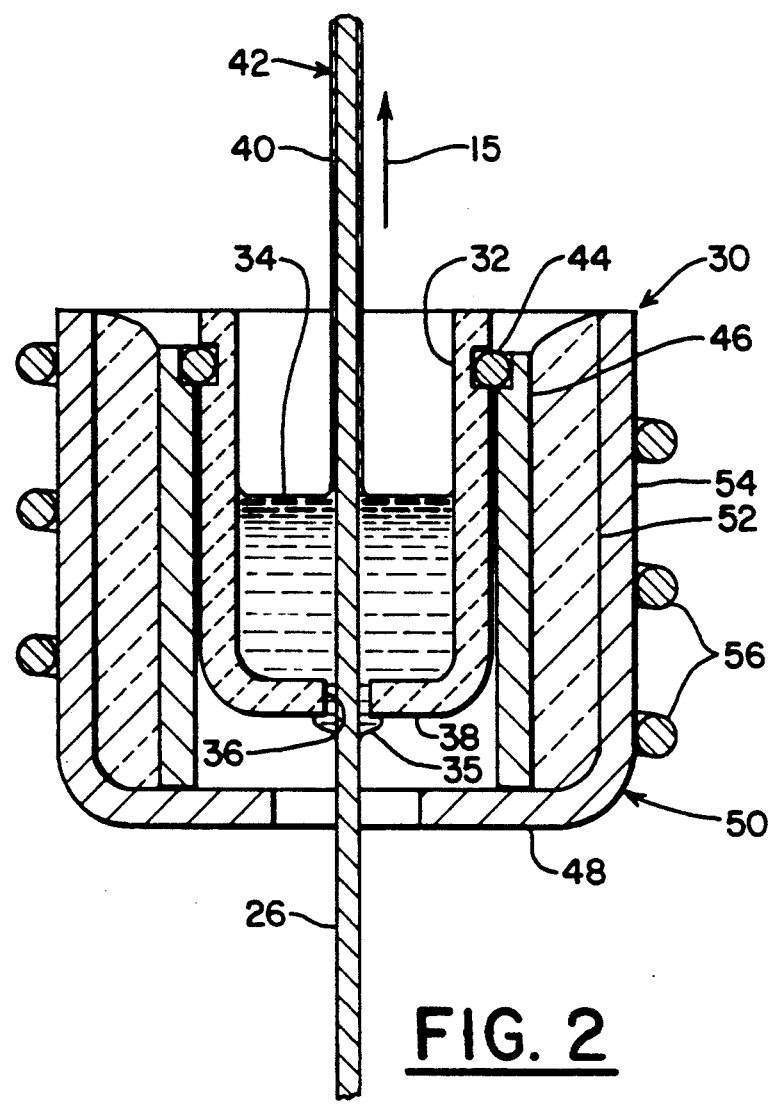
FIG. 2 is a cross-sectional view of the melt crucible or container used in this invention for continuous length coating taken along lines 2—2 of FIG. 1.

The melting and coating apparatus 30, as best seen in FIG. 2, may comprise a container 32 for containing liquid-phase, molten material 34, such as an oxide-type material, that has superconductive characteristics in its solid phase. This material 34 in its molten, liquid phase is also referred to as the melt. The container 32, as also shown in FIG. 2, preferably has a small orifice 36 in its bottom portion 38 just large enough in diameter to allow the substrate 26 to pass through it. As the substrate moves through the melt 34, as indicated by the arrow 15, it becomes coated with a thin layer or coating 40 of the melt material 34. This thin coating 40 solidifies in crystalline form on the substrate 26, and, when processed properly according to this invention, as described in more detail below, forms, in combination with the substrate 26, an elongated, flexible superconductive wire 42, or strip, that is bendable and can be wound on a spool, on a solenoid structure, or on other useful appliances as desired.

A small amount of the melt 34 might leak through the orifice 36 in the space between the substrate 26 and the bottom portion 38 of container 32. However, if that space is not very large and if the height or head of the melt 34 is not very large, it has been found that an upside down stable meniscus 35 of the melt 34 forms around the substrate 26, which effectively prevents any significant amount of the melt 34 from leaking through the orifice 36. For example, a 10- to 500-um diameter wire 26 extending through about a 1-mm diameter orifice 36 has been found to effectively contain a melt 34 of oxide-type material, such as a Bi-Sr-Ca-Cu-O mixture that is on the order of about 1 cm high.

The melt 34 can be made by powdering the superconductive material and then melting it, or, preferably, by melting a mixture of powdered components of the desired superconducting material. For example, the oxide powders $Bi_2O_3$, $SrO$, $CaO$, and $CuO$ mixed in approximately 1:2:2:2 molar ratio, when melted to the liquid phase 34 and then solidified to solid phase 40 on the substrate 26 according to this process, has a resulting composition that contains the $Bi_2Sr_2CaCu_2O_8$ superconducting phase, which actually with this molar ratio has been found to be closer to $Bi_2Sr_2Ca_{0.8}CU_2O_8$. Actually, a small range of compositions of these elements may be obtained, which are generalized as $Bi_2Sr_2CaCu_2O_8$. When the substrate 26 is pulled through this melt 34 at an appropriate rate, the coating 40 can grow single-crystal superconducting platelets of the material on the surface of the substrate 26. The linear movement of the substrate 26 out of the surface of the melt 34 as the crystalline metal oxide platelets are growing tends to align a larger proportion of the platelets with their longer dimensions in or nearer to the direction of the longitudinal axis of the substrate: in other words, the direction it is being pulled from the melt, rather than transverse to that direction. This coating 40, when annealed, as will be described in more detail below, then forms a continuous superconductive layer on the substrate 26. Yet, the superconductive layer 40 is thin enough to flex and bend with the substrate 26 without fracturing or interrupting the superconductive path.

High reaction temperatures in the vicinity of over 1100° C., such as in the range of about 1000°–1200° C., are required to completely liquify the materials, such as the mixed oxide powders described above. Therefore, high-temperature heating apparatus and container materials are required. The conductive heating and coating apparatus 30, as shown in FIG. 2, illustrates the container 32 comprised of a high-temperature refractory material or a metal with a high melting temperature, such as a ceramic material, suspended by an annular ring 44 in a cylindrical conductive sleeve 46. The sleeve 46 is set on the bottom portion 48 of a cup-shaped mounting structure 50. A high-temperature insulation material or heat barrier 52, such as quartz fiber insulation, is placed in the mounting structure 50 preferably between its sidewall 54 and the sleeve 46. An RF coil 56 is wrapped around the periphery of mounting structure 50, and, when actuated with a frequency in the range of, for example, 0.3–15 MHz, induces a current to flow in the metallic sleeve 46, which may be comprised of a high temperature-steel, such as a nickle steel alloy. This sleeve 46, therefore, is caused to heat up and is the heat source that causes the material 34 in container 32 to heat to, and maintain its temperature above, its melting point, as discussed above. Of course, other heating devices can also be used instead of the conductive device described above, as long as they can heat the material 34 in container 32 to the required temperature. For example, conductive sleeve 46 could be replaced with a coil-shaped heater made from an Fe-Cr-Al alloy.

The powdered material can either be placed in the container 52 and batch melted, or small amounts of the powdered mixture can be fed into container 32 on a continuing basis to continually replenish the melt being coated onto the substrate. Another alternative is to melt the powdered material in a different container (not shown) and feed it continuously into container 32 via a suitable heated conduit (not shown).

For a long-duration coating process, continual replenishment is necessary, both to replace material removed from the container 32 as it coats onto the substrate and also to maintain a fixed coating composition. Because of the complex phase diagram of the superconductive material, the composition in the container 32 may not necessarily be the same as that in the coating 40. However, an equilibrium condition can be attained if continuous replenishment is used, and if the composition of the source material is maintained the same as that desired in the coating 40. Therefore, the superconducting constituents should be continuously fed into the container 32 in proportions that match those desired in the finished superconductive coating 40, regardless of the actual proportions in the container 32, because in an equilibrium condition, the composition that comes out will be the same as the constituent components that are fed into the melt 34.

After the material 40 is coated on the surface of the substrate 26 at a rate that grows crystalline platelets of the superconductive material, as described above, annealing the material is usually necessary to achieve continuous intergrain coupling, connectivity, and superconductivity from platelet to platelet throughout the length of the finished wire filament or strip 42. Such annealing is most effective in the lower sintering temperature ranges. Sintering, of course, occurs at a temperature where grains or particles of a material fuse together to form a homogeneous mass without melting.

For example, an annealing temperature in the range of 800° to 950° C., preferably about 865°-875° C., for an appropriate time period, such as several hours, is effective to cause a coating of $Bi_2Sr_2CaCu_2O_8$ to become superconductive throughout its length. Therefore, an annealing chamber 20 surrounding the emerging substrate 26 coated with crystalline superconducting material 40 is provided, as shown in FIG. 1. Such an annealing chamber 20 can be an electric oven 58, sintering furnace, or the like, that can accommodate the elongated wire or strip 42. It could, of course, also be a separate apparatus from the coating apparatus.

The length of the path of the emerging superconductor wire or strip 42 through the annealing chamber 20 can be provided long enough to keep the wire or strip 42 in the annealing temperature for the desired length of annealing time as the substrate 26 is drawn through the melt 34 at the appropriate rate to achieve optimum crystal growth in the coating 40.

After the appropriate annealing time, the finished superconductive wire or strip 42 can be cooled to ambient or temperature, preferably at a controlled rate, such as about 10°-30° C. per hour. The cooling rate can be controlled by passing the wire or strip 40 through cooler zones of chamber 20 or through successive cooling stage ovens, which are not shown in the drawings since such controlled stage cooling would be within the knowledge and capabilities of persons skilled in this art once they understand the principles of this invention. The goal of the cooling rate is to reach room temperature, i.e., about 15°-30° C., with the crystalline platelet and needle structures of the metal oxide material still in conducting contact with adjacent crystalline structures and to avoid fractures, dislocations, and other imperfections in the crystalline structures to the extent possible. Usually, slower cooling rates are beneficial in this process, although thinner coatings usually do not require cooling times as long as those required for thicker coatings.

It has also been found that annealing and even the crystal coating formation as the substrate emerges from the melt are enhanced when carried out in an oxygen, $O_2$, environment. Therefore, it is preferred that $O_2$ be flowed through the coating and annealing environments.

Figure 3:
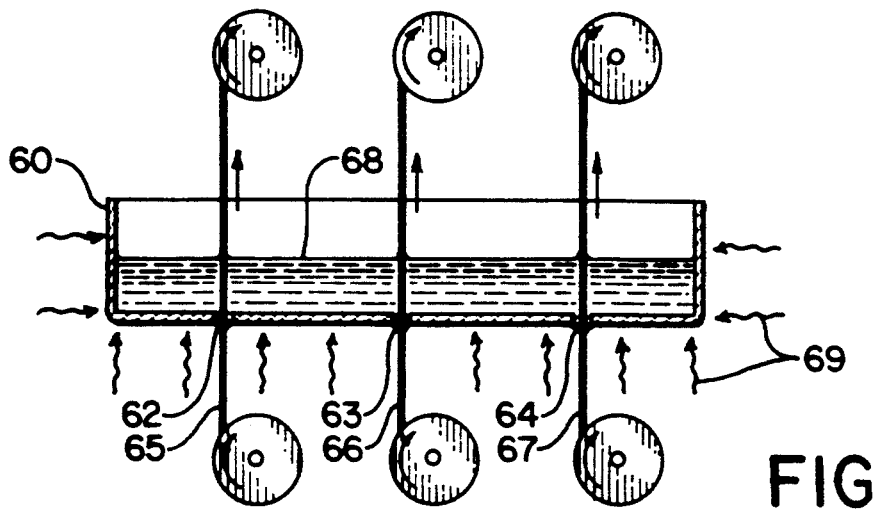
FIG. 3 is a schematic view in cross-sectional elevation of an enlarged crucible or container and a plurality of reels for coating a plurality of substrates with a melted superconductive material simultaneously with the method of this invention.

The apparatus described above for this process can be expanded, as illustrated in FIG. 3, to include a larger container 60 with a plurality of orifices 62, 63, 64 to accommodate continuous coating of a plurality of wires or strips 65, 66, 67 with the melt 68. The heating source in this expanded embodiment is represented schematically as the arrows 69 and can be any suitable apparatus, such as the RF coils described above, gas or electric furnaces, or the like. The annealing apparatus is not shown in FIG. 3, but it can be similar to that described above and shown in FIG. 1.

Figure 4:
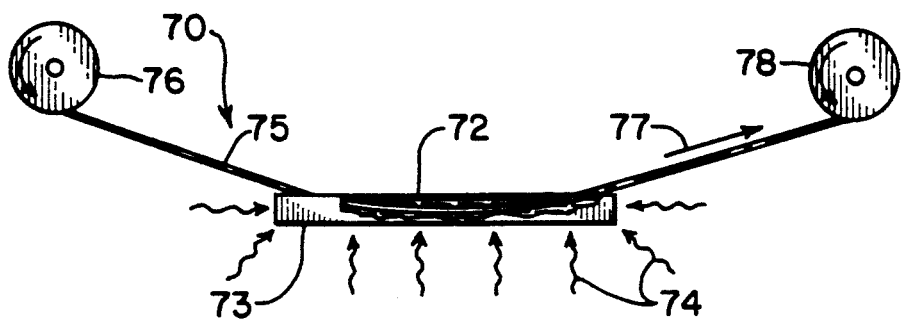
FIG. 4 is a schematic view in elevation of an alternate apparatus for continuously coating a long, flexible substrate with a superconductive material according to this invention.

In another embodiment 70, illustrated in FIG. 4, the melt 72 can be contained in a trough 73 with a surrounding heat source depicted by the arrows 74. The substrate strand or strip 75 can be unwound from a reel 76 and dropped into the melt 72 in trough 73 as it moves in the direction of arrow 77 to be wound on a take-up reel 78, solenoid body, or the like. Again, the annealing apparatus is not shown in FIG. 4, but it can be similar to that shown in FIG. 1 and described above. The rate of travel of the substrate 75 should be regulated, as described above, to induce optimum crystal growth in the coating material as it emerges from the melt 72.

Figure 5:
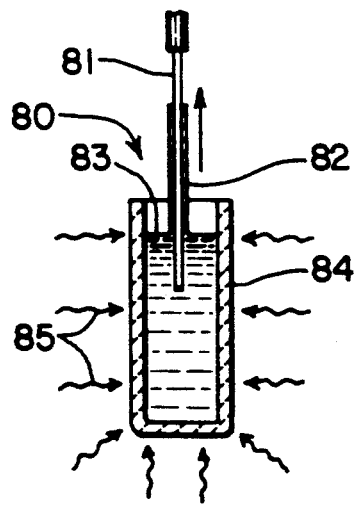
FIG. 5 is a schematic representation of an alternate dipping method of coating a shorter substrate with a melted superconductive material according to this invention.

In another alternate embodiment 80 illustrated in FIG. 5, a shorter length of substrate 81 can be coated with the superconductive material 82 by dipping it in the melt 83 of suitable components for growing superconductive crystals, as described above. The length of substrate 81 that can be coated in this manner is limited, of course, by the depth of the melt 83 in the container 84, although some length of the substrate could be pre-coiled (not shown) in the bottom of the container 84 and then pulled out of the melt 83. Complex shapes could be coated in this manner. Again, the heat source around the container 84 is indicated schematically by arrows 85; and an annealing chamber, although not shown in FIG. 5, is desirable, if not necessary, as described above. Also, as described above, the substrate 81 should be pulled out of the melt 83 at a rate conducive to optimum growth of crystals in the coating 82 as it emerges from the melt.

Figure 6:
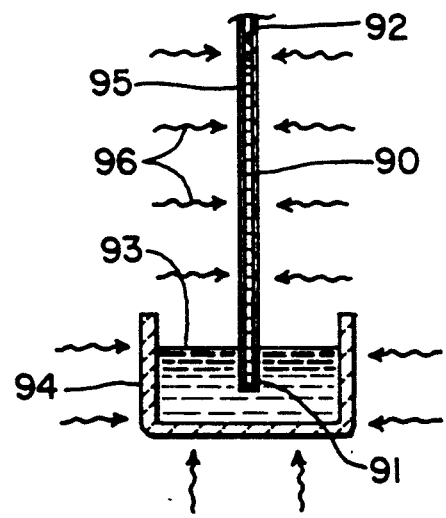
FIG. 6 is a schematic representation of an alternate differential pressure casing method of fabricating a length of superconductive material in a flexible embodiment according to this invention.

Another variation of this melt-coating substrate process of this invention is the melt substrate casting process illustrated in FIG. 6. In this casting process, an open end 91 of an elongated tubular substrate 90 is inserted into the melt 93 in a container 94. A differential pressure is applied, such as a vacuum in the other end 92 of tubular substrate 90 or an increased pressure over the surface of the melt 93 in container 94, or capillary rise, to force some of the melt 93 into the interior of tubular substrate 90 to create a column 95 of the material in the tube 90. In this method, it is necessary to apply the heat source, indicated by arrows 96, to the desired length of the column 95 in tubular substrate 90 to keep the material melted until that length of tubular substrate 90 is filled. The tubular substrate 90 can then be removed and placed in an annealing oven (not shown) for the desired time, as described above, to form a solid, crystalline superconductive core in the tubular substrate 90.

The substrate material for each of the process embodiments described above is preferably thin and flexible, so that the coated end product is also flexible and can be bent or wound into coils or other desired shapes. However, they must also be able to withstand the very high melting temperatures of the superconductive materials, such as in the range of 1000°-1200° C. Some elemental metals, such as platinum, are suitable for this purpose. However, less expensive alternative substrate materials may include alumina ($Al_2O_3$), which is flexible in thin filaments, as well as other oxides and various metal alloys, for example, Ag-Pd, Cu-Pd, Cu-Ni, and the like. In combination with the coating according to this invention, the substrate materials can form very usable superconductive wire strands or ribbon strips. The substrate wire filaments or strips can be anywhere from about 5 $\mu$m to over 500 $\mu$m thick. It has been found that longer annealing times may cause more of a tendency of the superconducting material to separate from alumina substrates than from platinum substrates, so annealing times should be monitored to be long enough to obtain good superconductivity, but not long enough to cause undesirable separation from the substrate. On the other hand, in some cases, especially in using flat strip or ribbon substrates, it may be desirable to obtain separation to produce free-standing, thin sheets of superconductive materials for special purposes or testing.

EXAMPLE 1

A 1:2:2:2 molar ratio of $Bi_2O_3$:SrO:CaO:CuO powdered oxides was mixed, placed in an alumina crucible, and heated to 1147° C. in flowing $O_2$. After the reaction subsided, a quiescent melt formed. Alumina sheets 13 mm wide and alumina filaments 2.5 mm in diameter were dipped into the melt and withdrawn at speeds ranging from 2 to 15 mm/min. A Meissner effect (magnetic flux expulsion as the temperature passes through $T_c$) was not observed on the as-grown coatings, although slower rates or long after heaters can change this result. However, after annealing in $O_2$ for two days, a strong Meissner effect was observed on both sheet and filament coatings. Furthermore, in some cases, the sheet coatings could be removed from the substrates to yield free-standing superconducting sheets.

EXAMPLE 2

All the processes illustrated in FIGS. 1, 2, 5, and 6 were used for solidification of high-$T_c$ superconducting sheets and filaments from a melted mixture of oxide powders. In all cases of this example, crucibles or containers composed of 99.8% alumina were used. However, numerous other oxide crucibles, such as MgO, or $Zr_2O_3$:Y, and various metal crucibles, such as Pt, could also be used. The starting materials were $Bi_2O_3$,SrO,-CaO, and CuO with ACS-grade or higher purity. A typical feed composition comprised molar ratios of $Bi_2O_3$:SrO:CaO:CuO=1:2:2:2, although superconducting coatings were also obtained from starting compositions 1:2:1:2, 1:2:2:1, 0.43:2:10:5, and others. In some cases PbO was also added, and molar ratios were $Bi_2O_3$:PbO:SrO:CaO:CuO=3:2:6:6:8. The complete range of possible starting compositions has not yet been fully explored. The oxide powders were ground and mixed before placement in the crucible or container. After heating to about 1150° C. and reaction of the oxides, the substrates were inserted in the liquid melt and coated. Alumina sheets up to 13 mm wide and various filament materials, including alumina, platinum, and other metallic wires, with diameters ranging from 25 μm to 2.5 mm were used as substrates and coated with thin Bi-Sr-Ca-Cu-O layers by passage through a liquid melt of the mixed oxides. Coating rates between 2 and 1800 mm/min. were used, and film thicknesses between 5 μm and 500 μm were attained. After annealing at 875° C. for several hours and then cooling at the rate of about 30° C./h. or less to ambient temperature, the coatings were tested and exhibited a superconducting transition onset near 80K.

Advantages of this high temperature melt process include the ability to make dense coatings that comprise interconnecting single crystal superconducting platelets up to about 4 mm in length formed on elongated, flexible filaments and strips. From analysis of the real, X', and imaginary, X", components of ac magnetic susceptibility, along with resistivity measurements, it was found that there appears to be virtually lossless intergrain coupling and good connectivity in these Bi-Sr-Ca-Cu-O superconductors formed from the liquid phase melt. The superconducting phase predominantly obtained by this process has a composition near $Bi_2Sr_2Ca_{0.8}Cu_2O_8$ (as determined by electron-beam microprobe analysis of single crystals), and an orthorhombic/pseudo-tetragonal crystal structure with $a \approx 0.54$ nm, $b \approx 0.54$ nm, and $c \approx 3.06$ nm, determined by x-ray diffraction and TEM selected-area diffraction.

This description was based primarily on the bismuth, strontium, calcium, and copper oxides because those materials have been of most interest recently for their higher $T_c$ potentials, but the processes and apparatus of this invention can also be used with other superconductive oxide mixtures, such as, for example, yttrium, barium, copper oxide ($YBa_2Cu_3O_{7-x}$), or thallium calcium barium copper oxide ($Tl_2CaBa_2Cu_2O_8$ or $Tl_2Ca_2Ba_2Cu_3O_{10}$), as well as other materials. Also, it is possible to use carbonates for some of the oxides in the starting constituent materials of the superconductive end-product material desired. For example, one starting constituent of the $Bi_2Sr_2CaCu_2O_8$ superconductive material described above might be $SrCO_3$, instead of SrO. The high temperature required for the liquid phase melt can generally be expected to burn off the carbon, leaving the Sr and O for the metal oxide superconductor.

It has been found recently that a layer of silver adjacent a superconducting material enhances the superconducting continuity along its length. The process and apparatus of this invention are readily adaptable to providing an additional silver or other appropriate metallic layer on the elongated superconductive wires or strips produced as described above. Such addition, significantly, can be combined advantageously, according to this invention, with the annealing step described above. Specifically, as shown in FIG. 7, an additional heating and coating apparatus 130 can be combined with the heating and coating apparatus 30 to provide an overcoating of silver, silver alloy, or other appropriate metal on the exterior of the superconductive coating 40, either after or, preferably, as a part of the annealing process.

Figure 7:
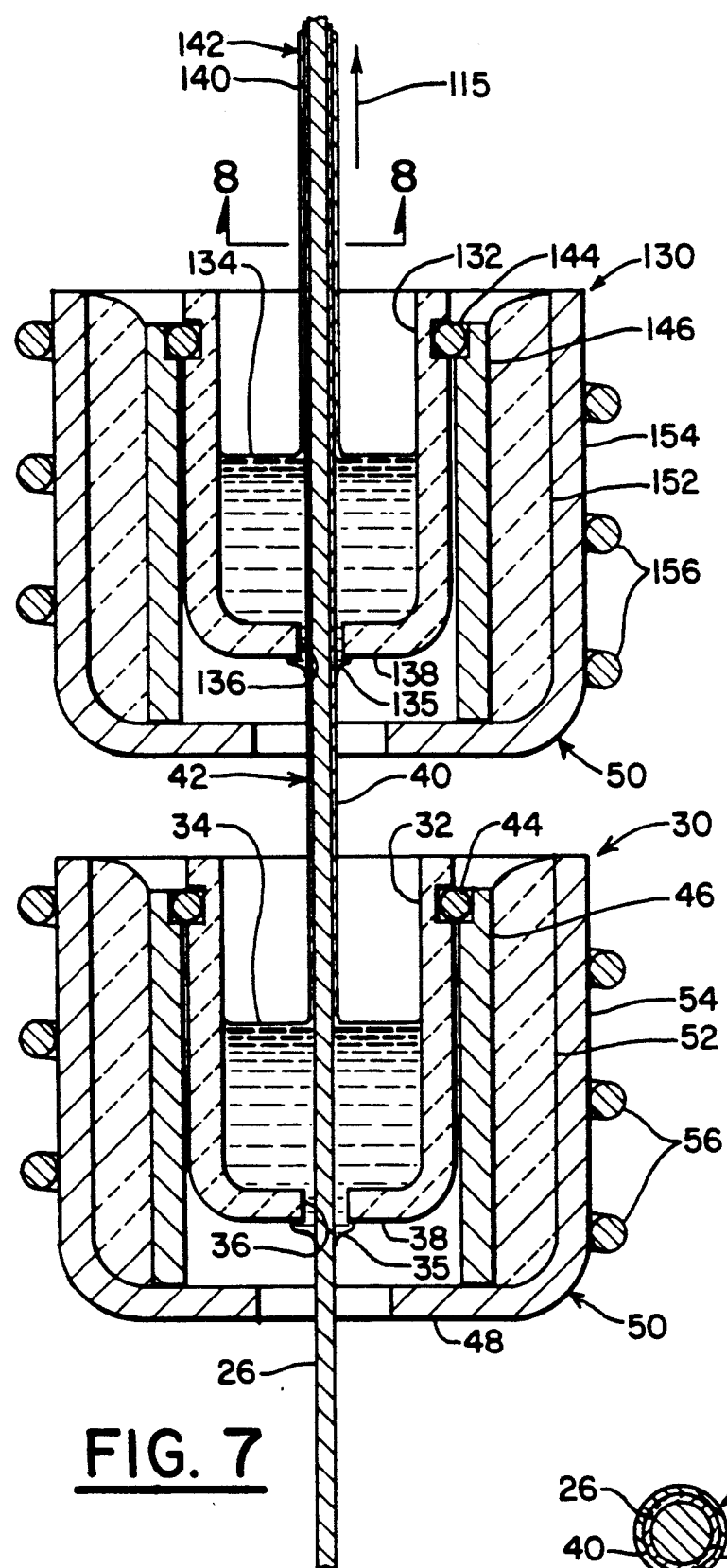
FIG. 7 is a cross-sectional view of a combined dual coating apparatus according to the present invention for adding a metallic overcoat in the annealing process.
Figure 8:
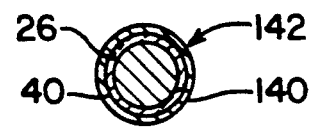
FIG. 8 is an enlarged cross-sectional view of the metal-core/superconductor/metal-clad composite superconducting strip according to this invention taken along lines 8—8 of FIG. 7.

As shown in FIG. 7, the first heating and coating apparatus 30 is the same as that shown in FIGS. 1 and 2 and described above. The second heating and coating apparatus 130 is similar to the first and is preferably positioned just over the first to receive the superconductive coated wire or strip 42 as it emerges from the melt 34 in container 32. This second heating and coating apparatus 130 also has a container 132 for containing a quantity of molten metal or metal alloy 134, such as silver, silver antimony alloy, silver lead alloy, silver tin alloy, or the like. The superconductive coated wire or strip 42 passes through an orifice 136 in the bottom 138 of container 132 into the molten metal or metal alloy 134. As the superconductive coated wire or strip 42 emerges from the container 132, it is coated with the metal or metal alloy, which then cools and solidifies to form a permanent, integral metal or metal alloy overcoat 140, as shown in FIGS. 7 and 8. The composite superconductive wire or strip 142 with the metal or metal alloy overcoat 140 can continue moving in the direction of arrow 115 in FIG. 7, as described above, to a take-up reel, solenoid, or other device (not shown).

The second heating and coating device 130 can have any heat source capable of maintaining the metal or metal alloy 134 in its liquid phase, but it is shown in FIG. 7 for convenience as being comprised of the container 132 suspended in a heating element sleeve 146, which is mounted in a cup-shaped container 154, and with a layer of insulation 152 between the sleeve 146 and the container 132. An RF coil 156 around the container 154, when actuated, causes the sleeve 146 to heat, as described above for the heating and coating apparatus 30. Also, as described above, with the proper sizing, the molten metal or metal alloy 134 can be contained by an upside down meniscus 135 under orifice 136 around the wire or strip 42.

With this apparatus, the hot molten metal or metal alloy 134 can provide the annealing heat required for the superconductive coating 40. In fact, since the melting point of silver, which is the desired metal overcoating, is about 960° C. and the desired annealing temperature for the superconductive coating is near that range, it is beneficial to combine the overcoating process with the annealing step. Actually, as described above, a slightly lower annealing temperature, more in the range of 850°–880° C. is really preferred to keep from getting too close to the melting point of the superconductive material 40. Therefore, some adjusting, such as providing a silver alloy with a slightly lower melting temperature, such as silver-antimony, silver-lead, silver-tin, or the like, is desirable to keep the temperature of the molten overcoating material 134 in container 132 closer to the 850°–880° C. range. Therefore, the heat of the metal or metal alloy 134 anneals the superconductive coat 40 as it passes through the container 132.

The metal-core/superconductor/metal-clad composite elongated superconductor strip 142 of FIGS. 7 and 8 can be further processed, as necessary or desirable to achieve optimum superconductive capabilities. For example, when the substrate 26 is a ductile metal-core material, such as Pt, Cu-Ni, Ag-Pd, or Cu-Pd, and the overcoat 140 is a ductile metal-cladding, such as Ag, Ag-Sb, Ag-Pb, or Ag-Sn, as described above, the composite strip 140 is malleable and can be cold worked and heat treated in a manner designed to increase coupling between the superconducting grains, thus improving critical current density ($J_c$). The first heat treatment step, as described above, occurs in the annealing step concurrent with immersion in the hot, melted overcoat material 134. The cold working steps can be a swaging process similar to that described by M. Mimura et al., supra, or by reducing the diameter of the wire composite 140 by rolling it or drawing it through progressively smaller openings in hard-shaped dies (not shown), which complements the continuous production capabilities and advantages of the present invention. Cold working by any other mechanical deformation, pressing, rolling, hammering, or similar process would, of course, also be satisfactory.

The foregoing is considered as illustrative only of the principles of the invention. Further, because numerous modifications and changes will readily occur to those skilled in the art, it is not desired to limit the invention to the exact construction and operation shown and described, and accordingly, all suitable modifications and equivalents may be resorted to falling within the scope of the invention as defined by the claims which follow.

The embodiments of the invention in which an exclusive property or privilege is claimed are defined as follows:

1. The method of fabricating elongated, flexible members of crystalline, superconductive compound coated on a substrate, comprising the steps of:
   mixing powders of the metal oxide constituents;
   heating said mixture to a temperature high enough to result in a liquid melt of said mixture of said metal oxide constituents;
   immersing an elongated, flexible substrate in said melt and withdrawing it from the melt at a rate conducive to crystal growth of the metal oxides on the emerging surface of the substrate to thereby create a crystalline coating of the superconductive compound on the substrate; and
   cooling the coated substrate.

2. The method of claim 1, including the step of annealing the coated substrate at about the sintering temperature of the metal oxide material.

3. The method of claim 2, including the steps of annealing the coated substrate by immersing the coated substrate in a pool of liquid phase metallic material heated to about the sintering temperature of the metal oxide material, withdrawing the coated substrate from the pool of liquid phase metallic material with an overcoating of the metallic material remaining on the coated substrate, and cooling the metallic material overcoating to convert it to its solid phase.

4. The method of claim 1, including the step of continuously moving an elongated substrate through said melt such that some portion of the substrate is continuously entering the melt as some other portion is emerging from the melt.

5. The method of claim 4, including the step of continuously replenishing said melt as the metal oxides are continuously coated on the emerging substrate.

6. The method of claim 5, including the step of continuously replenishing said melt with metal oxide constituents in proportions that are the same as those proportions of the constituents desired in the coating of the metal oxide on the substrate.

7. The method of claim 6, including the step of adding $Bi_2O_3$, $SrO$, $CaO$, and $CuO$ as the metal oxide constituents in the molar ratio of $Bi_2O_3:SrO:CaO:CuO = 1:2:2:2$.

8. The method of claim 6, including the step of immersing the coated substrate in a pool of liquid phase metallic material and withdrawing the coated substrate from the pool of liquid phase metallic material with an overcoating of the metallic material remaining on the coated substrate, and cooling the metallic material.

9. The method of claim 8, including the steps of alternately cold working and heat treating the overcoated superconductive member.

10. The method of claim 9, wherein the substrate is a metallic material.

11. The method of claim 10, wherein the substrate is a material selected from the group consisting of Cu-Ni, Ag-Pd, Cu-Pd, and Pt.

12. The method of claim 10, wherein the overcoating is a material selected from the group consisting of Ag, Ag-Sb, Ag-Pd, and Ag-Sn.

13. The method of claim 4, including the step of passing the coated portions of the substrate emerging from the melt through an annealing chamber having a temperature in the range of the sintering temperature of the metal oxide with a sufficient dwell time in the annealing chamber to cause crystalline platelets and needles of the metal oxides to conductively connect with adjacent crystalline platelets and needles of the metal oxides, so that the coating, when cooled to its critical temperature $T_c$, will be a continuous superconductive material throughout its length.

14. The method of claim 13, including the step of cooling the coated substrate to room temperature at a rate not in excess of about 30° C./hour after annealing.

15. The method of claim 1, including the step of using $Bi_2O_3$, SrO, CaO, and CuO as metal oxide constituents.

16. The method of claim 15, including the step of mixing said metal oxide constituents in the molar ratio of $Bi_2O_3$:SrO:CaO:CuO=1:2:2:2.

17. The method of claim 16, including the step of heating said metal oxide mixture to the range of about 1000°–1200° C. and maintaining that temperature range to get a quiescent melt.

18. The method of claim 17, including the step of annealing the coated substrate after it emerges from the melt in a temperature range of about 800°–900° C.

19. The method of claim 18, including the step of annealing the coated substrate by immersing the coated substrate in a pool of liquid phase metallic material heated to a temperature in said range of about 800°–900° C., withdrawing the coated substrate from the pool of liquid phase metallic material with an overcoating of the metallic material remaining on the coated substrate, and cooling the metallic material overcoating to convert it to its solid phase.

20. The method of claim 19, wherein said metallic material is a silver alloy.

21. The method of claim 18, including the step of annealing the coated substrate for a period of about 1 to 3 hours.

22. The method of claim 21, including the step of cooling the coated substrate at a rate of about 20°–40° C. per hour to room temperature of about 15°–30° C. after annealing.

23. The method of claim 1, including the step of using metal oxide constituents that form said coating with a $YBa_2Cu_3O_{7-x}$ superconducting material.

24. The method of claim 1, including the step of using metal oxide constituents that form said coating with $Tl_2CaBa_2O_8$ or $Tl_2Ca_2Ba_2Cu_3O_{10}$ superconducting material.

25. The method of claim 1, including the step of using a substrate comprised of a material selected from the group consisting of alumina, Pt, Cu-Ni, Ag-Pd, and Cu-Pd.

26. The method for producing high-$T_c$, crystalline, superconducting material in the form of elongated structures, comprising the steps of:
(a) heating a powdered oxide mixture of a 1:2:2:2 molar ration of $Bi_2O_3$:SrO:CaO:CuO to about 100°–1200° C. in an $O_2$ atmosphere until a quiescent melt of said metal oxide constituents is formed of said mixture;
(b) drawing an elongated alumina substrate in and out of said melt at a rate that causes a portion of said melt to cling to said substrate and crystallize as it emerges from the melt and thereby cause said substrate to be coated with a layer of crystalline structures formed from said melt;
(c) cooling said coated substrate to about 800°–900° C. and annealing it in an $O_2$ atmosphere at this temperature; and
(d) cooling said coated substrate to room temperature.

* * * * *